United States Patent
Liu et al.

(10) Patent No.: US 9,607,881 B2
(45) Date of Patent: Mar. 28, 2017

(54) INSULATOR VOID ASPECT RATIO TUNING BY SELECTIVE DEPOSITION

(71) Applicant: Taiwan Semiconductor Manufacturing Company, Ltd., Hsin-Chu (TW)

(72) Inventors: Hsiang-Wei Liu, Tainan (TW); Yu-Chieh Liao, Taoyuan (TW); Tien-Lu Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 18 days.

(21) Appl. No.: 14/310,870

(22) Filed: Jun. 20, 2014

(65) Prior Publication Data

US 2015/0371940 A1 Dec. 24, 2015

(51) Int. Cl.
*H01L 21/768* (2006.01)
*H01L 21/764* (2006.01)
*H01L 23/522* (2006.01)
*H01L 23/528* (2006.01)
*H01L 23/532* (2006.01)

(52) U.S. Cl.
CPC ........ *H01L 21/764* (2013.01); *H01L 21/7682* (2013.01); *H01L 21/76849* (2013.01); *H01L 23/5222* (2013.01); *H01L 23/5283* (2013.01); *H01L 23/53295* (2013.01); *H01L 21/76885* (2013.01); *H01L 23/53223* (2013.01); *H01L 23/53238* (2013.01); *H01L 23/53252* (2013.01); *H01L 23/53266* (2013.01); *H01L 2924/0002* (2013.01)

(58) Field of Classification Search
CPC ...................... H01L 21/76879; H01L 21/7682
USPC .......................................................... 257/522
See application file for complete search history.

(56) References Cited

U.S. PATENT DOCUMENTS

| | | | |
|---|---|---|---|
| 6,440,839 B1 | 8/2002 | Partovi et al. | |
| 8,399,349 B2 | 3/2013 | Vrtis et al. | |
| 2009/0093122 A1* | 4/2009 | Ueda | C30B 25/18 438/701 |
| 2009/0115061 A1* | 5/2009 | Chen | H01L 21/76807 257/751 |
| 2009/0294898 A1* | 12/2009 | Feustel | H01L 21/76885 257/522 |
| 2011/0021036 A1* | 1/2011 | Braecklmann | H01L 21/7682 438/763 |
| 2011/0237075 A1 | 9/2011 | Nitta et al. | |
| 2012/0043654 A1* | 2/2012 | Lu | C25D 5/10 257/737 |

* cited by examiner

*Primary Examiner* — Mark Prenty
(74) *Attorney, Agent, or Firm* — Slater Matsil, LLP

(57) ABSTRACT

Disclosed herein is a structure conductive lines disposed in a base layer and separated by a first region. Pillars are each disposed over a respective one of the conductive lines. A dielectric fill layer is disposed over the pillars and extending between the pillars into the first region, and a void is disposed in the dielectric fill layer in the first region between the conductive lines.

20 Claims, 8 Drawing Sheets

INSULATOR VOID ASPECT RATIO TUNING BY SELECTIVE DEPOSITION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs requiring new design and production techniques.

In particular, electrical isolation of adjacent devices is a factor affecting the design and production of devices with increasing functional density. For example, transistors that are adjacent to each other are isolated with nonconductive features such as shallow trench isolation (STI) structures. Similarly, conductive electrical lines are electrically isolated in insulating dielectric layers. As the spacing between devices has decreased, the spacing allocated for isolation features has decreased as well.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
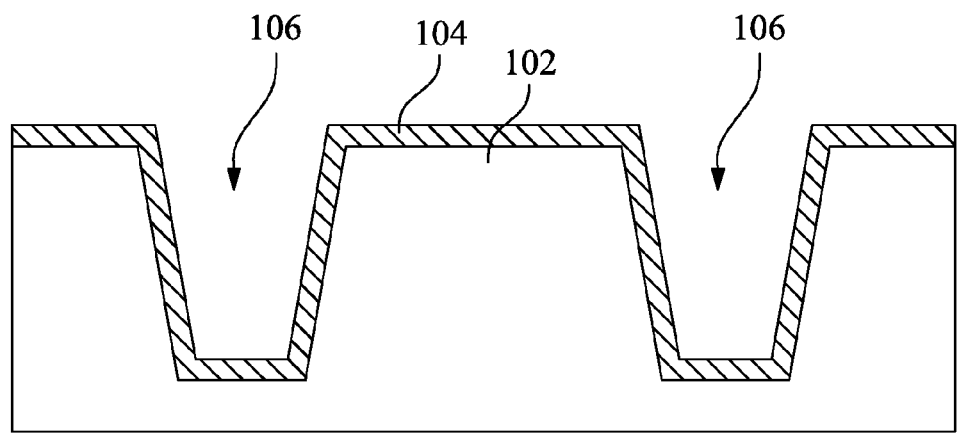
FIGS. 1 through 10 illustrate cross-sectional views of intermediate processing steps in forming pillars and tuning voids according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In integrated semiconductor devices, metal lines are disposed in dielectric layers over active devices, and those metal lines provide signal connectivity between the different active devices, and between active devices and external devices. However, as the size and density of the active devices shrink, the metal lines are brought closer and closer together. The proximity of the metal lines can create interference between adjacent metal lines due to the electromagnetic field created by electrical signals passing over the lines. That is, an electrical signal over one conductive line creates a magnetic field that may induce an unintended electrical signal in the adjacent line. This unintended electrical signal in the adjacent line interferes with the intended signal, resulting in a noisy signal.

The resistance or susceptibility to the electromagnetic field by a material is referred to as the permittivity, dielectric constant, or k value. A low k material will have a dielectric constant the same as, or lower than silicon dioxide, and a high k material has a dielectric constant greater than silicon dioxide. A low k material has a lower permittivity, that is, the low k material permits less of the electromagnetic field to pass through the material. Therefore, using a low k material to separate adjacent conductive lines permits those lines to be closer together without signals in the conductive lines causing interference in respective adjacent lines.

Air has a lower k value than most other solid materials. Embodiments described herein provide a void between adjacent conductive lines, thereby increasing the resistance to interferences between adjacent lines. Described herein are embodiments of a method for forming a structure with an isolation structure having a void with an improved aspect ratio for the void. The void is formed by depositing a dielectric material in an opening, with the dielectric material closing over the opening before the opening is completely filled with the dielectric material. The unfilled area forms a void between the adjacent conductive lines.

It has been discovered that the void shape can be tuned by forming metal pillars over the conductive lines prior to dielectric deposition. The pillars cause the dielectric material enclosing the void to form with small wall thicknesses between the adjacent conductive lines. The pillars cause dielectric material to enclose the void at a higher height, and at an earlier stage, than a structure without the pillars. Thus, a region between adjacent conductive lines can have a void structure formed with an improved ratio of air to dielectric material, increasing the resistance to interference in a given space, or reducing the spacing required between adjacent lines.

FIGS. 1 through 10 are cross-sectional views of various intermediate process steps for forming upright pillars and height tuning the aspect ratios of voids according to some embodiments. Referring initially to FIG. 1, there are shown trenches formed in a base layer 102 and a liner layer 104 formed along sidewalls of the line trenches 106. Initially, a base layer 102 is provided. In some embodiments, the base layer 102 is a low k dielectric material, and in some embodiments, is a carbide such as $SiC_x(CH_3)_y$, a siloxane such as $SiO_x(CH_3)_y$, a doped oxide, such as fluorine (F), carbon (C) or hydrogen (H) doped silicon oxide (SiO), a polymer such as a polyimide, polybenzoxazole (PBO), hydrogen silsesquioxane (HSQ) or methylsilsesquioxane (MSQ) material, or another low k material. The base layer 102 is, in some embodiments, a metallization layer or intermetal dielectric layer in, for example, a redistribution layer (RDL) structure, or a protective layer in, for example, a post-passivation interconnect (PPI) layer, or another layer in an integrated circuit device or package. In other embodiments, the base layer 102 is a semiconductor substrate or layer, with a dielectric structure having a void disposed between active devices as a shallow trench isolation (STI) structure. In other embodiments, the base layer 102 is a insulating or dielectric layer disposed over a semiconductor substrate or layer.

Line trenches 106 are etched in the base layer 102, providing space for filling with a conductive material to form conductive lines. In an embodiment, the base layer 102 is masked with, for example, a hard mask, photoresist, or the like. A pattern in the mask forms openings though which an etchant etches the base layer. 102. The line trenches 106 are etched to a depth between about 40 nm and about 85 nm.

In an embodiment, the etch parameters vary based on the base layer 102 material. For example, where the base layer 102 is a carbide such as $SiC_x(CH_3)_y$, an etch using carbon tetraflouride ($CF_4$), sulfur hexafluoride ($SF_6$), chlorine trifluoride ($ClF_3$) or the like is used. Additionally, the etching is performed, in some embodiments, with a plasma etching process using, for example, an oxygen ($O_2$) or chlorine (Cl) plasma. In other embodiments, a wet etch, dry etch or reactive ion etch (RIE) are used to form the line trenches 106. In another example, where the base layer 102 is SiO, etching the base layer 102 is performed with a wet etch using, for example, a buffered oxide etch (BOE) that uses a combination of ammonium fluoride ($NH_4F$) and hydrofluoric acid (HF). In other embodiments, the base layer 102 is etched with a p-etch using, for example HF and nitric acid ($HNO_3$), or with another etching process. In other embodiments, for example, where the base layer 102 is a polymer or the like, the line trenches 106 are formed with a laser, by milling, or are formed by molding the line trenches 106 into the base layer 102.

A liner layer 104 is formed over the base layer 102, and extends into the line trenches 106. In an embodiment, the liner layer 104 is formed by a blanket deposition process such as chemical vapor deposition (CVD), plasma enhanced CVD (PECVD) process, physical vapor deposition (PVD) process, or another process, and is formed with a thickness between about 20 angstroms and about 50 angstroms. In some embodiments, the liner layer is tantalum nitride (TaN), or another material, and provides adhesion for subsequently deposited metal layers.

Figure 2:
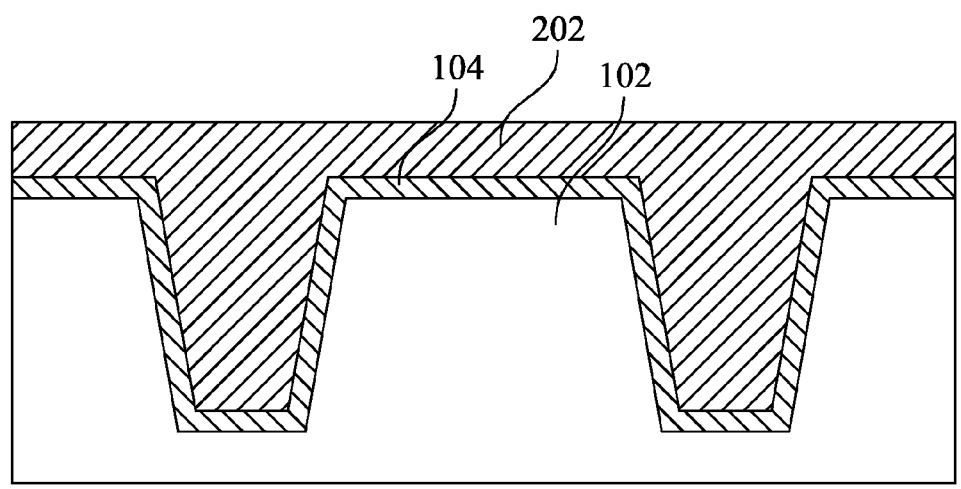

FIG. 2 is a cross-sectional view of a processing step for forming a conductive layer 202 according to some embodiments. The conductive layer 202 is deposited over the liner layer 104 to fill the line trenches 106 with a PVD, CVD, electroplating, electroless plating or other formation process. The conductive layer 202, in some embodiments, extends over the top surface of the base layer 102. The conductive layer 202 may be formed from copper (Cu), aluminum (Al), aluminum-copper alloy (AlCu), titanium (Ti), gold (Au), tantalum (Ta), or another metal, alloy, or conductive material.

Figure 3:
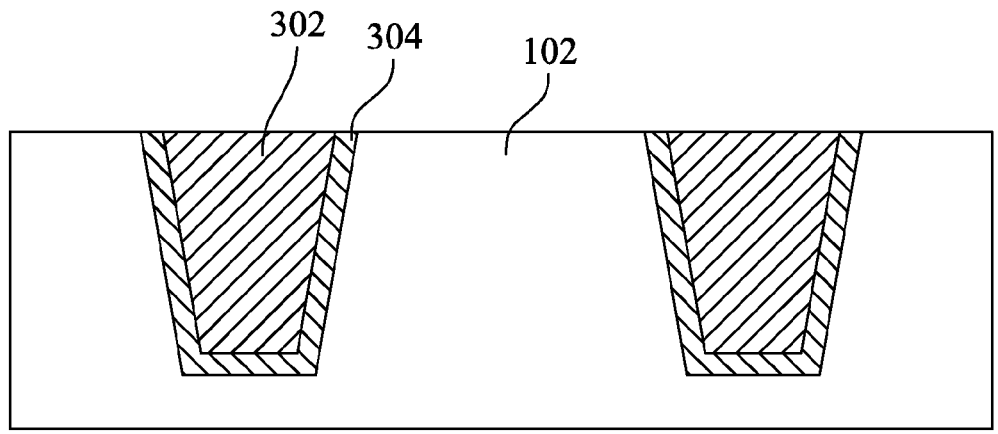

FIG. 3 is a cross-sectional view of a processing step for forming lines 302 and liners 304 according to some embodiments. The conductive layer 202 (e.g., FIG. 2) and liner layer 104 are reduced by, for example, grinding, a chemical-mechanical polish (CMP), by etching, milling, or another process. The remaining material forms the lines 302 and liners 304 disposed in the base layer 102. In an embodiment, the top surfaces of the lines 302 and liners 304 are substantially level or planar with the top surface of the base layer 102. After the reduction of the conductive layer 202, the lines 302 have a depth of 80 nm or less, such as between about 40 nm and about 80 nm, which has been determined to permit an advantageous void formation between the lines 302. Additionally, after reducing the conductive layer 202, the lines 302 are spaced apart by between about 40 nm and about 80 nm. It has been determined that such a line spacing is achievable with the void structure proposed herein, as the improved, lower k value of the region between the lines 302 provided by the improved void permits closer line 302 spacing at standard voltages.

Figure 4:
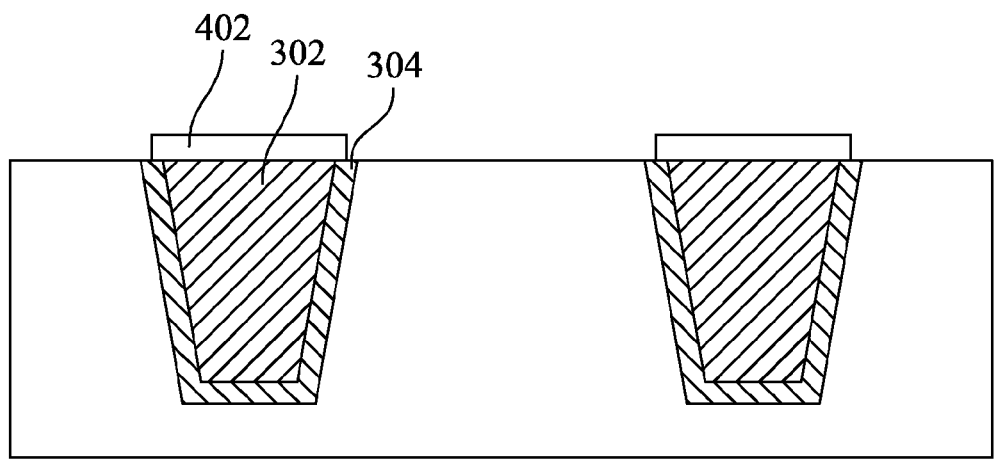

FIG. 4 is a cross-sectional view of a processing step for forming a cap layer 402 according to an embodiment. A cap layer 402 is formed from, for example, cobalt (Co), titanium, or another material is deposited over the lines 302 to isolate and provide a barrier for the lines 302. The cap layer prevents oxidation and contamination of the line 302 material, increasing reliability. In an embodiment, the cap layer 402 is a selectively deposited metal formed on the line 302. The selective deposition forms the cap layer 402 over the metal portion of the lines 302 without depositing metal on the base layer 102. This permits the elimination of a mask or an etching step that would be needed to pattern, for example, a deposited layer. However, the described embodiments are not limited to selective deposition, as deposition and etching, or masking and deposition are used, in some embodiments, to form the cap layer 402.

In some embodiments, selective deposition is performed using, for example, a CVD deposition process. For example, a Co cap layer 402 is formed using a $C_5H_5(CO)_2Co$ precursor in a hydrogen ($H_2$) environment. In such an embodiment, the environment is maintained at a temperature between about 100° C. and about 300° C. and a pressure between about 10 torr and about 50 torr. The deposition process selectively deposits a Co layer over the top surface of the line 302 to form the cap layer 402. In other embodiments, a CVD process is used to selectively deposit a cobalt cap layer.

Figure 5:
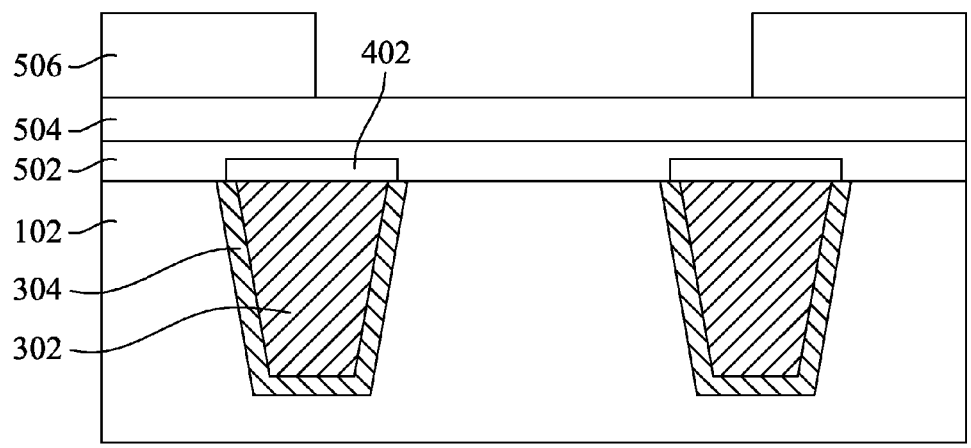

FIG. 5 is a cross-sectional view of a processing step for a forming hard mask with an etch stop layer 502 and first mask layer 504 according to an embodiment. An etch stop layer 502 is deposited over the base layer 102, and in some embodiments, is a nitride such as silicon nitride (SiN), an oxynitride such as silicon oxynitride (SiON) or another etch stop material. The etch stop layer 502 is formed, in some embodiments, from a CVD or PVD process, or another process. A first mask layer 504 is formed over the etch stop layer 502. In an embodiment, the first mask layer 504 is an oxide such as SiO or another material and may be formed by a CVD or PVD process, or another process. Additionally, a second mask layer 506 is formed over the first mask layer 504. The second mask layer 506 is, in some embodiments, a photoresist that is developed and patterned to create an opening over the first mask layer 504 and etch stop layer 502, with the opening extending between the lines 302.

Figure 6:
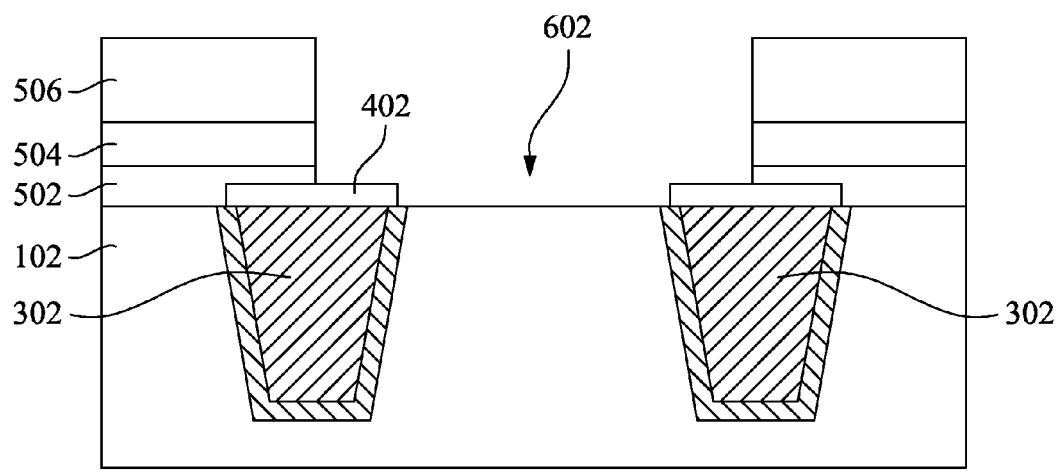

FIG. 6 is a cross-sectional view of a processing step for patterning the etch stop layer 502 and first mask layer 504 according to an embodiment. The first mask layer 504 and etch stop layer 502 are etched to create an opening 602 defined by the second mask layer 506. In an embodiment, the openings in the first mask layer 504 and etch stop layer 502 extends over the space between adjacent lanes as illustrated in FIG. 6.

In an embodiment where the first mask layer 504 is, for example, an oxide such as SiO, the first mask layer 504 is wet etched with a buffered oxide etch, p-etch of the like. Additionally in an embodiment where the etch stop layer 502 is a nitride such as silicon nitride, the etch stop layer is wet etched with phosphoric acid ($H_3PO_4$).

Figure 7:
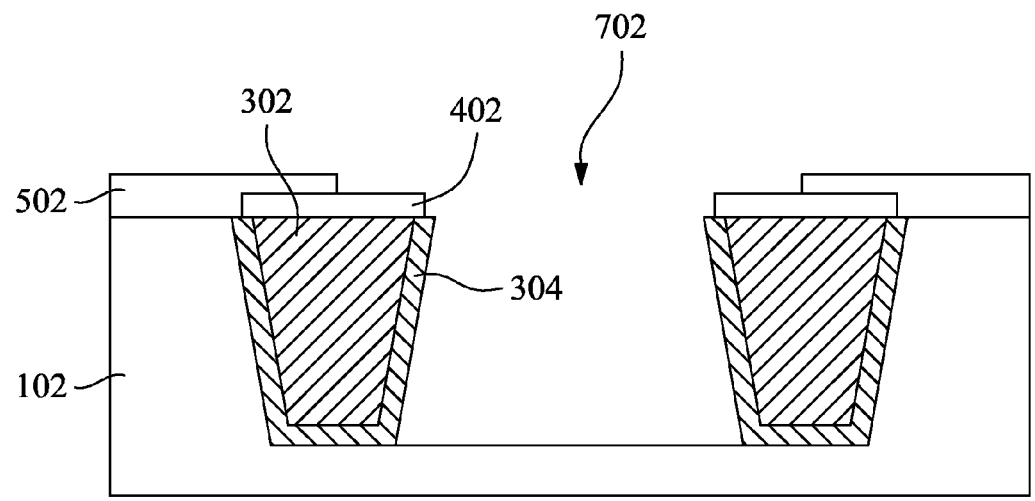

FIG. 7 is a cross-sectional view of a processing step for forming a gap opening 702 according to an embodiment. The first mask layer 504 and second mask layer 506 (e.g., FIG. 6) are removed, with the etch stop layer 502 remaining covering portions of the base layer 102 outside of the void region between the lines 302. In some embodiments, the etch stop layer 502 covers a portion of the line 302 and cap layer 402. The void opening 702 is formed by selectively etching the base layer 102 between the lines 302. In an embodiment, the gap opening 702 is etched so the gap opening 702 extends to at least about the bottom surface of the lines 302 or liners 304. An anisotropic etch reduces lateral etching under the liners 304 if the gap opening 702 is etched below the bottom surface of the liners 304. A selective etch, such as a wet etch using a BOE, p-etch, $CF_4$, $SF_4$ or $ClF_3$, is used to form the gap opening 702 in the base layer 102. The wet etch tends to erode or etch lines 302 and liners 304. However, in other embodiments, RIE, dry etching, ion milling or another etch process is used.

Figure 8:
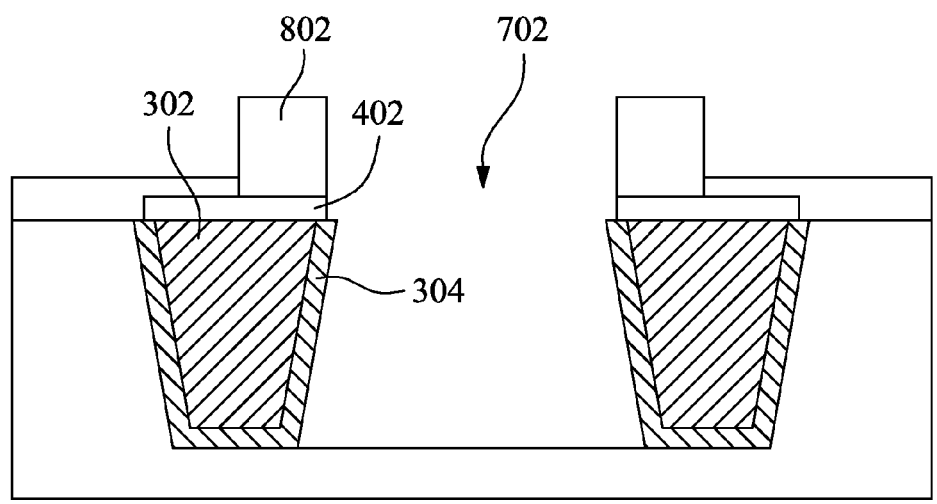

FIG. 8 is a cross-sectional view of a processing step for forming pillars 802 according to an embodiment. In an embodiment, the pillars 802 are formed over a portion of the cap layer 402 by selective deposition. In such an embodiment, the pillars 802 form on the exposed portions of the cap layer 402. In some embodiments, the pillars 802 have a height over the cap layer that is between about 10 nm and about 30 nm. It has been discovered that such a height for the pillars 802, combined with the height of the lines 302, permits formation of a void in a dielectric layer having an increased air-to-dielectric ratio.

In some embodiments the pillars 802 are formed from cobalt using a selective deposition, as described above with respect to the cap layer 402. In other embodiments, the pillars 802 are formed by masking and deposition, or by deposition, masking and etching. In some embodiments the pillars 802 extend substantially vertically from the cap layer 402. In such embodiments the lowermost or bottom surface of the pillars 802 are disposed above the line 302.

While the pillars 802 are shown as being over lines 302 in the base layer 102, the pillars 802 are formed where adjacent lines 302 are parallel to each other. The pillars may be omitted in regions such as lands, landing pads or the like. Since the pillars 802 are formed on the top surface of the lines 302, omitting the pillars 802 in the land regions prevents interference by the pillars 802 with vias, connectors such as a solder balls or the like or other structures formed on the top surface of a land or line. Thus, in some embodiments, the pillars 802 extend along the lines 302, but terminate before a land or other vertical connection point.

Figure 9:
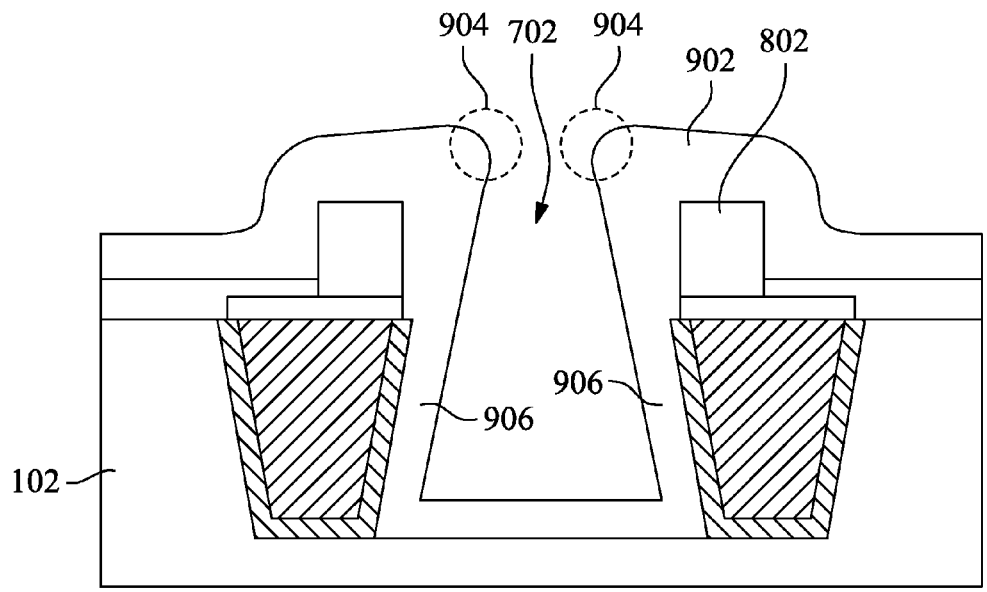

FIG. 9 is a cross-sectional view of a processing step for forming a dielectric fill layer 902 extending into the gap opening 702 according to an embodiment. A low k dielectric material is blanket formed over the pillars 802, for example, using a PECVD deposition process. In some embodiments, the dielectric fill layer 902 is a carbide such as $SiC_x(CH_3)_y$, an oxide, a siloxane such as $SiO_x(CH_3)_y$, a doped oxide, such as an F, C or H doped oxide, a polymer such as a polyimide, PBO, HSQ or MSQ material, or another low k material. In some embodiments, the dielectric fill layer 902 is formed from the same material as the base layer 102 material, and in other embodiments, the dielectric fill layer 902 is formed from a different material than the base layer 102 material.

During the fill process, the void opening 702 remains open so that the dielectric fill layer 902 is deposited in the void opening 702 to form dielectric sidewall regions 906 on the sidewalls of the lines 302 and liners 304. The dielectric fill layer 902 tends to accumulate more thickly on outside corners, forming closeout points 904, for example, around the corners of the pillars 802. While the closeout points 904 are separated, the dielectric fill layer deposition process deposits material in the void opening 702, increasing the thickness of the dielectric sidewall regions 906.

Figure 10:
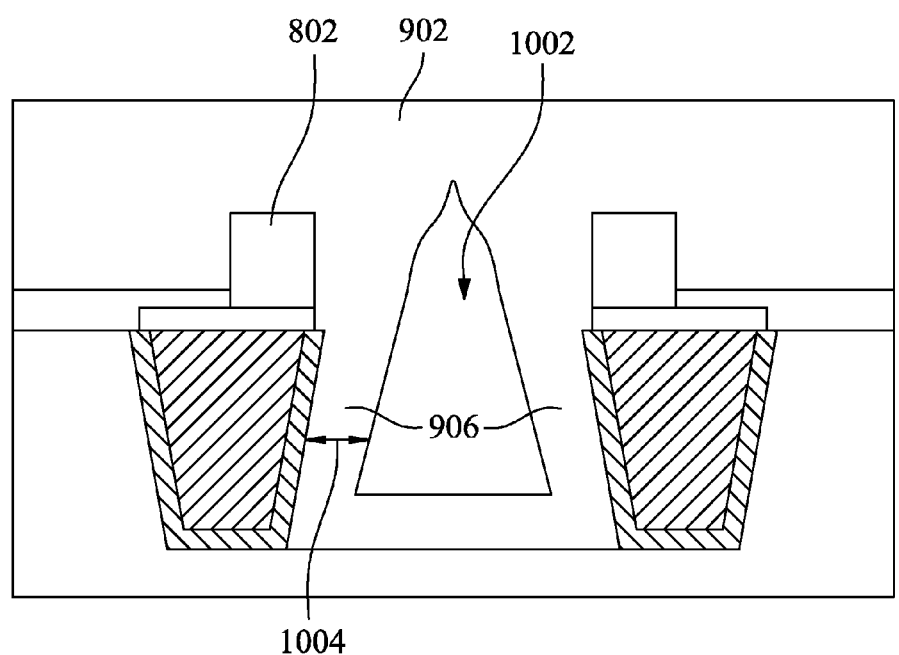

The pillars 802 extend the walls of the gap opening 702 vertically by raising the aspect ratio of the lines 302 and pillars 802 and the void opening 702. After forming the pillars 802, the aspect ratio of the lines 302 and pillars 802 combined is between about 1.3 and about 1.6. The lines 302 are spaced apart by between about 40 nm and about 80 nm, FIG. 10 is a cross-sectional view of a processing step for forming a void 1002 in the dielectric fill layer 902 according to an embodiment. While the formation of the dielectric fill layer 902 continues, the closeout points 904 extend toward each other and close off the void opening 702 to form the void 1002. Closing the void 1002 stops the deposition process from depositing dielectric material in the dielectric sidewall regions 906. The dielectric fill layer 902 traps a gas in the void 1002, with the gas in the void 1002 controlling the k value of the void. In some embodiments, the void 1002 traps gas from the processing environment. For example, the void 1002 may have air, nitrogen, oxygen, argon, or other gases disposed therein.

Air provides a lower and better dielectric constant or k value than most solid material. Thus, increasing the ratio of air to solid dielectric material in the void opening 702 lowers the effective dielectric constant of the space between the lines 302, resulting in less interference, cross-talk and noise in adjacent lines 302. It has also been discovered that the pillars 802 raise the close off points 904 and cause the void 1002 to close off earlier in the dielectric fill process, resulting in a thinner dielectric sidewall thickness 1004. In an embodiment, the dielectric sidewall thickness 1004 is between about 3 nm and about 8 nm, with the remaining void opening 702 comprising the void 1002. In some embodiments, the void 1002 extends above the topmost surface of the pillars 802 by between about 10 nm and about 20 nm.

Figure 11:
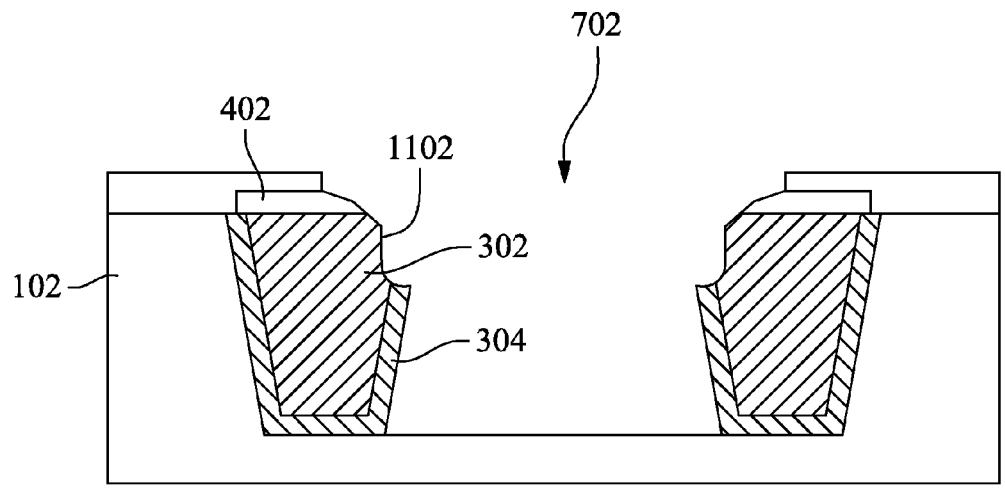
FIGS. 11 through 13 illustrate cross section views of intermediate processing steps in forming rounded pillars and tuning voids according to an embodiment.
Figure 12:
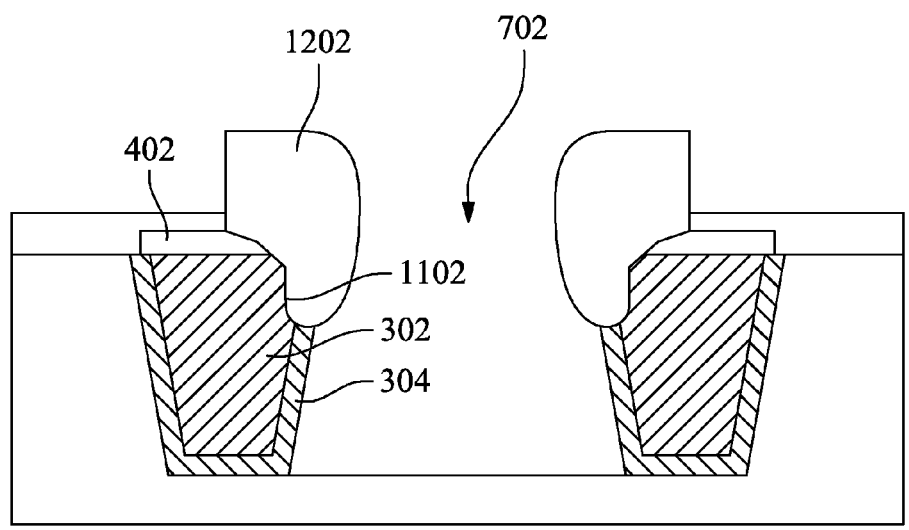
Figure 13:
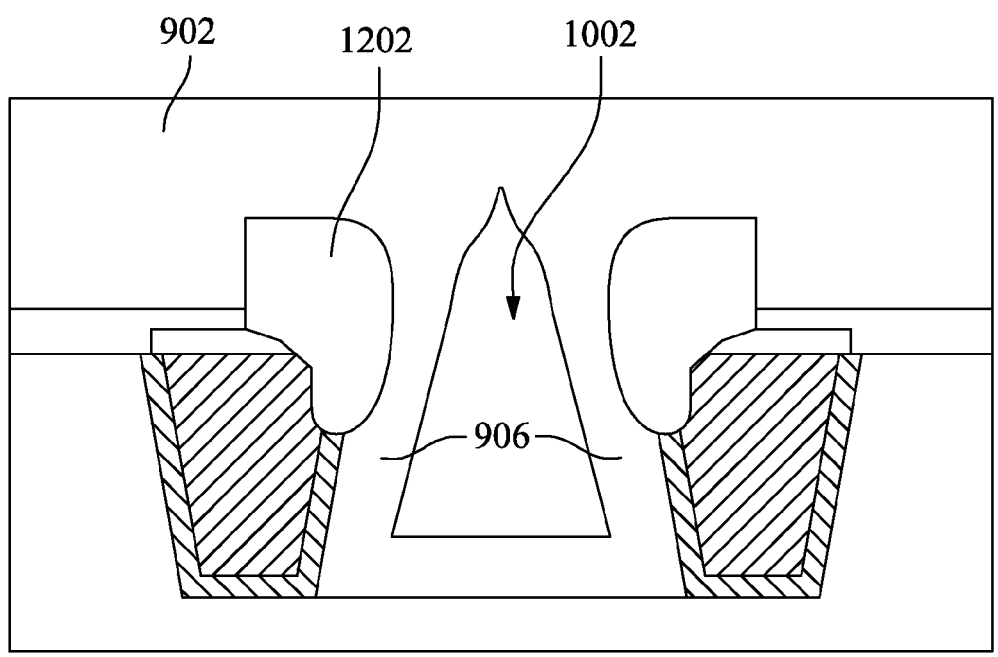

FIGS. 11 through 13 are cross-sectional views of various intermediate process steps for forming rounded pillars and tuning the aspect ratios of voids according to some embodiments. FIG. 11 is a cross-sectional view of a processing step for forming a gap opening 702 and recessed line 302 surfaces according to an embodiment. In such an embodiment, a dry etch such as a plasma etch using $CF_4$, $SF_4$ or $ClF_3$ is used to form the gap opening 702 in the base layer 102. The dry etch tends to erode the liners 304 and the corner surface of the lines 302, creating a recessed surface 1102. The erosion of the liners 304 exposes portions of the lines 302 below the top surfaces of the lines 302

FIG. 12 is a cross-sectional view of a processing step for forming rounded pillars 1202 according to an embodiment. In an embodiment, the rounded pillars 1202 are formed through selective deposition, as described above with respect to FIGS. 4 and 8. In such an embodiment, the rounded pillars 1202 form on the portions of the lines 302 exposed at the recessed surface 1102. The rounded pillars 1202 are, in some embodiments, cobalt, or in other embodiments, are another metal, an alloy, a dielectric, a polymer, or another material. The rounded pillars 1202 extend laterally into the void opening 702 due to the recessed surface 1102 exposing a portion of the line 302 that faces into the void opening 702. In some embodiments the rounded pillars 1202 have a first portion above the cap layer 402 and a second extending portion laterally from the line 302. In such embodiments the lowermost or bottom portion of the rounded pillars 1202 are disposed below the cap layer 402. Additionally, in some embodiments, the etch leaves a portion of the cap layer 402 over the line 302. In such an embodiment, the pillars 1202 form on the exposed portions of the cap layer 402 and extend above the lines 302 by between about 10 nm and about 30 nm, and extend into the void opening 702 by between about 3 nm and about 10 nm. It has been discovered that such a height and lateral extension for the rounded pillars 1202 permits tuning of the width and height of the void 1002 by closing the dielectric layer over the void at predictable and controllable stages. In such an embodiment, the spacing between the rounded pillars 1202 is about 70 nm or less, such as between about 30 and about 70 nm, a range of distances that permits void formation while maintaining the spacing of the lines 302. Additionally, in such an embodiment, after forming the rounded pillars 1202, the aspect ratio of the lines 302 and rounded pillars 1202 is between about 1.5 and about 2.0.

FIG. 13 is a cross-sectional view of a processing step for forming a void 1002 between rounded pillars 1202 according to an embodiment. A dielectric fill layer 902 is formed over the pillars and extends into the void opening 702. It has been discovered that tuning the width of a portion of an upper the void opening 702 results in an improved control of the dielectric sidewall region 906 deposition. The rounded pillars 1202 cause the void to close with a thinner dielectric sidewall region 906 than a square, upright pillar 802, due to the a smaller spacing between the rounded pillars 1202. Closeout points 904, as shown in FIG. 9, form on the rounded pillars 1202 to close out the void opening 702 before the void opening 702 is completely filled.

Figure 14:
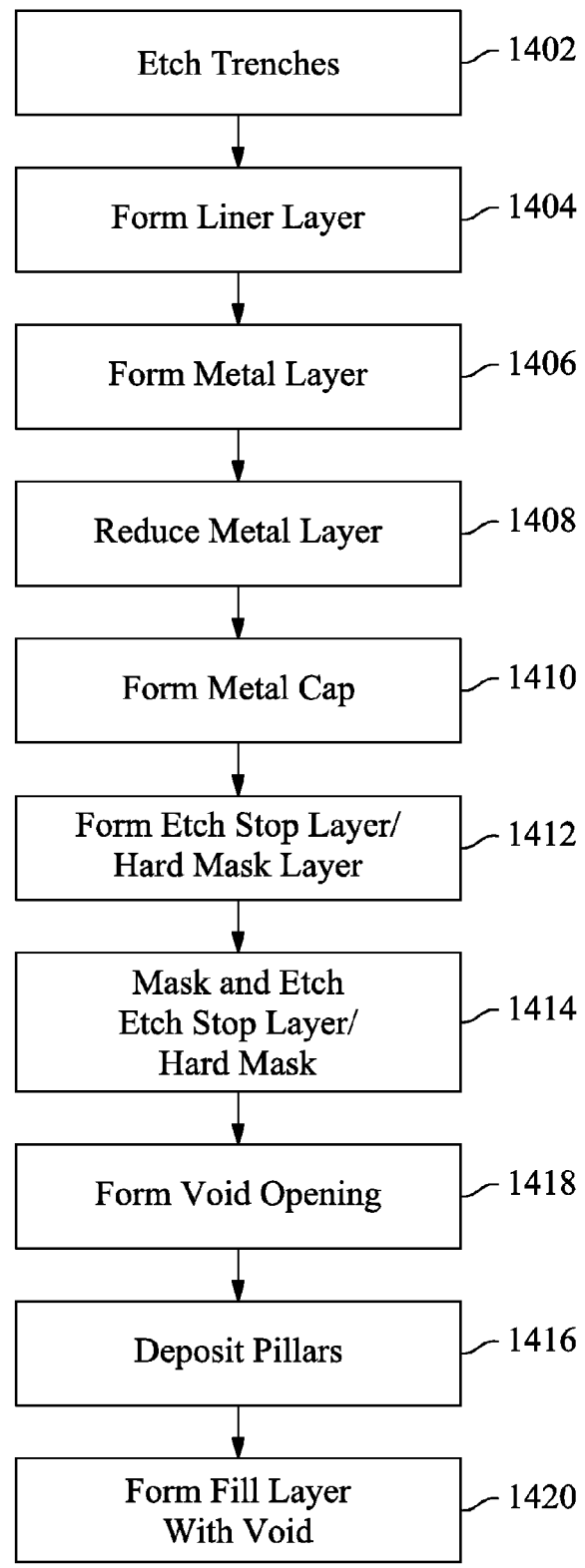
FIG. 14 is a flow diagram illustrating a method of forming pillars according to some embodiments.

FIG. 14 is a flow diagram illustrating a method of forming pillars according to some embodiments. Initially, a base layer is provided, and in block 1402, line trenches are etched in the base layer. In block 1404, a liner layer is formed over the base layer and extending into the line trenches. A metal layer is formed, in block 1406, over the liner layer and fills the remaining portion of the line trenches. In block 1408, the metal layer and liner layer are reduced to form the lines and liners. In block 1410, a metal cap layer is formed over the top surface of the lines, and in block 1412, an etch stop layer and mask layer are formed over the cap layer. In block 1414, the mask layer and the etch stop layer are mask and etched or otherwise patterned to expose a portion of the base layer between the lines. In block 1416, a void opening is formed in the base layer between the lines, and rounded or upright pillars are formed in block 1418. A dielectric fill layer is formed over the pillars and in the void opening, with the dielectric fill layer covering the void opening, resulting in a void in the dielectric fill layer between the lines.

Thus, according to an embodiment, a structure comprises conductive lines disposed in a base layer and separated by a first region, and pillars, each pillar disposed over a respective one of the conductive lines. A dielectric fill layer is disposed over the pillars and extends between the pillars into the first region. A void in the dielectric fill layer is disposed in the first region between the conductive lines. The void extends over top surfaces of the pillars. In some embodiments, liners are between the base layer and the conductive lines. In some embodiments, cap layers are disposed over the conductive lines. The cap layers and the pillars comprise cobalt. In some embodiments, the pillars extend over the conductive lines, and each of the pillars has a bottommost surface disposed over a topmost surface of a respective one of the conductive lines. In other embodiments, each of the pillars has a first pillar portion disposed over a respective one of the conductive lines, and each of the pillars has a second pillar portion disposed on a sidewall of the respective one of the conductive lines and extending laterally from the conductive line into the first region. The dielectric fill layer has dielectric sidewall portions disposed on sidewalls of the conductive lines.

In an embodiment, a structure, comprises a base layer having a trench disposed therein, wherein the base layer comprises a dielectric material. A plurality of liners are disposed in the trench and a plurality of conductive lines are each disposed in the trench on a respective one of plurality of liners, and the plurality of conductive lines are separated by one or more void regions. A plurality of cap layers are each disposed on a top surface of a respective one of the plurality of conductive lines. Each of a plurality of pillars are disposed over a respective one of the plurality of conductive lines. A dielectric layer is disposed over the base layer in each of the one or more void regions, the dielectric layer having one or more voids disposed in respective ones of the one or more void regions. The void extends over top surfaces of the pillars by a first distance that is, in some embodiments, between about 10 nm and about 20 nm. In an embodiment, the cap layers and the pillars comprise cobalt. In an embodiment, the pillars extend over the conductive lines by between about 10 nm and about 30 nm. Each of the conductive lines, in combination with a respective one of the pillars, has an aspect ratio of about 1.3 to about 1.6. In some embodiments, each of the pillars has a portion disposed on a sidewall a respective one of the conductive lines and extending laterally from the line into an adjacent void region. The dielectric layer extends under the one or more voids and has dielectric sidewall portions disposed on sidewalls of the liners and extending under the one or more voids. In some embodiments, the dielectric sidewall portions have a lateral thickness from about 3 nm to about 8 nm.

A method according to an embodiment comprises providing a dielectric base layer having liners disposed in trenches in the dielectric base layer and conductive lines disposed in recesses in the liners and forming cap layers over respective ones of the conductive lines. Void regions are etched in the dielectric base layer between adjacent ones of the conductive lines. Pillars are formed on the cap layers, with each of the pillars disposed over a respective one of the conductive lines. A dielectric fill layer is formed over the pillars and extends between the conductive lines into the void regions, the dielectric fill layer enclosing voids in the void regions. In some embodiments etching the void regions comprises wet etching the void regions, the liners separating the conductive lines from the void regions after the wet etching. In such an embodiment, forming the pillars comprises selectively depositing a metal on the cap layers, with the pillars extending upward from the cap layers. In other embodiments, etching the void regions comprises dry etching the void regions, with the dry etching eroding portion of the liners and portions of the conductive lines to create recessed surfaces on the conductive lines. In such an embodiment, forming the pillars comprises selectively depositing a metal on the recessed surfaces of the conductive lines and on the cap layers to form a rounded pillar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   conductive lines disposed in a base layer and separated by a first region;
   pillars, each pillar disposed over a respective one of the conductive lines;
   a dielectric fill layer disposed over the pillars and extending between the pillars into the first region; and
   a void in the dielectric fill layer in the first region between the conductive lines, wherein the void is completely encapsulated by the dielectric fill layer, wherein a bottommost portion of the void is wider than a topmost portion of the void.

2. The structure of claim 1, wherein the void extends over top surfaces of the pillars.

3. The structure of claim 1, further comprising liners interposed between the base layer and the conductive lines.

4. The structure of claim 1, further comprising cap layers over the conductive lines.

5. The structure of claim 4, wherein the cap layers and the pillars comprise cobalt.

6. The structure of claim 1, wherein the pillars extend over the conductive lines, and wherein each of the pillars has a bottommost surface disposed over a topmost surface of a respective one of the conductive lines.

7. The structure of claim 1, wherein the each of the pillars has a first pillar portion disposed over a respective one of the conductive lines, and wherein each of the pillars has a second pillar portion disposed on a sidewall of the respective one of the conductive lines and extending laterally from the conductive line into the first region.

8. The structure of claim 1, wherein the dielectric fill layer contacts the conductive lines.

9. A structure, comprising:
   a base layer having a trench disposed therein, wherein the base layer comprises a dielectric material;
   a plurality of liners disposed in the trench;
   a plurality of conductive lines each disposed in the trench on a respective one of the plurality of liners, wherein the plurality of conductive lines are separated by one or more void regions;
   a plurality of cap layers each disposed on a top surface of a respective one of the plurality of conductive lines;
   a plurality of pillars, each disposed over a respective one of the plurality of conductive lines; and
   a dielectric layer disposed over the base layer in each of the one or more void regions, the dielectric layer having one or more encapsulated voids disposed in respective ones of the one or more void regions, the one or more encapsulated voids having a lowermost portion proximate the base layer and an uppermost portion distal to the base layer, the lowermost portion being wider than the uppermost portion.

10. The structure of claim 9, wherein the encapsulated voids extend over top surfaces of the pillars by a first distance.

11. The structure of claim 10, wherein the first distance is between about 10 nm and about 20 nm.

12. The structure of claim 9, wherein the cap layers and the pillars comprise cobalt.

13. The structure of claim 9, wherein the pillars extend over the conductive lines by between about 10 nm and about 30 nm.

14. The structure of claim 9, wherein each of the conductive lines, in combination with a respective one of the pillars, has an aspect ratio of about 1.3 to about 1.6.

15. The structure of claim 9, wherein each of the pillars has a portion disposed on a sidewall of a respective one of the conductive lines and extending laterally from the conductive line into an adjacent void region.

16. The structure of claim 9, wherein the dielectric layer extends under the one or more encapsulated voids; and
   wherein the dielectric layer has dielectric sidewall portions disposed on sidewalls of the liners and extending under the one or more encapsulated voids.

17. The structure of claim 16, wherein the dielectric sidewall portions have a lateral thickness from about 3 nm to about 8 nm.

18. A structure, comprising:
   a base layer;
   at least two conductive lines disposed in the base layer, the at least two conductive lines being separated by a void region;
   a cap layer disposed on a top surface of a respective conductive line of the at least two conductive lines;
   an etch stop layer disposed over the base layer, the at least two conductive lines and the cap layer;
   at least two pillars, each pillar disposed on at least a portion of a respective cap layer;
   a dielectric layer disposed over the base layer, the dielectric layer extending into the void region; and
   at least one void enclosed by the dielectric layer in the void region, the void having a bottommost portion and a topmost portion, the bottommost portion wider than the topmost portion.

19. The structure of claim 18, wherein the at least one void comprises air, nitrogen, oxygen, argon, or combinations thereof.

20. The structure of claim 18, wherein the at least two pillars are rounded, extend above the conductive lines by between about 10 nm and 30 nm, and extend laterally into the void region by between about 3 nm and about 10 nm.

* * * * *